United States Patent [19]
Casal et al.

[11] Patent Number: 5,822,596
[45] Date of Patent: Oct. 13, 1998

[54] CONTROLLING POWER UP USING CLOCK GATING

[75] Inventors: Humberto Felipe Casal; Hehching Harry Li, both of Austin; Trong Duc Nguyen, Webster; Nandor Gyorgy Thoma, Plano, all of Tex.

[73] Assignee: International Business Machines Corporation, Armonk, N.Y.

[21] Appl. No.: 554,206

[22] Filed: Nov. 6, 1995

[51] Int. Cl.[6] .......................... H03K 21/00; G06F 13/00
[52] U.S. Cl. ........................ 395/750.04; 395/556
[58] Field of Search .............. 395/750, 750.04, 395/556; 364/707; 327/143; 377/47

[56]     References Cited

U.S. PATENT DOCUMENTS

| | | |
|---|---|---|
| 4,758,945 | 7/1988 | Remedi . |
| 4,893,271 | 1/1990 | Davis et al. . |
| 5,142,684 | 8/1992 | Perry et al. . |
| 5,222,239 | 6/1993 | Rosch . |
| 5,325,074 | 6/1994 | Suenaga . |
| 5,355,502 | 10/1994 | Schowe et al. . |
| 5,369,771 | 11/1994 | Gettel . |
| 5,418,969 | 5/1995 | Matsuzaki et al. . |
| 5,524,035 | 6/1996 | Casal et al. . |

*Primary Examiner*—Jack B. Harvey
*Assistant Examiner*—Rupal C. Dharia
*Attorney, Agent, or Firm*—Kelly K. Kordzik; Winstead Sechrest & Minick P.C.; Anthony V. S. England

[57]     ABSTRACT

During power up and power down of logic circuitry implemented in CMOS, the clock signal supplied to the logic circuitry is incremented and decremented, respectively, to avoid a sudden application or removal of the clock signal to the logic circuitry.

15 Claims, 7 Drawing Sheets

FIG. 3

PRIOR ART

| DIVIDE RATIO | DIV_SEL (0..1) | CMPR RST | CMPR SET |
|---|---|---|---|
| 1 | 00 | 001 | 000 |
| 2 | 01 | 011 | 001 |
| 3 | 10 | 101 | 010 |
| 4 | 11 | 111 | 011 |

CONTROLLING POWER UP USING CLOCK GATING

TECHNICAL FIELD OF THE INVENTION

The present invention relates generally to a system and method for powering up and powering down CMOS circuits in a computer system. More particularly, the present invention relates to a system and method for increasing and decreasing the frequency of the clock signals to a set of CMOS circuits in such a way as to avoid potentially damaging transient current fluctuations and/or permanent damage to the chip that could lead to functional errors.

BACKGROUND OF THE INVENTION

A transient is the name of a phenomenon that an electrical system experiences when a sudden change in the condition of the system occurs. The result is a voltage or current surge, which can be harmful to electronic components. Transient signals frequently occur during power up and power down operations, and avoiding them is a goal in chip design. One way to avoid these fluctuations is to apply or remove power to the chips gradually, allowing the current levels to stabilize at intermediate levels before proceeding to full power up or power down. In traditional bipolar technology, this translates into gradually increasing the voltage of the power supply until full power is attained. However, in complimentary metal oxide semiconductor (CMOS) architecture, increasing the voltage would not accomplish this goal because CMOS logic circuits do not draw power unless they are in a switching state. Because CMOS circuits utilize much less power than their bipolar counterparts, power fluctuations have generally not been a problem in CMOS chips. But recent advances in chip design have led to greater chip density and operation speed and therefore power consumption. As a result, transient current levels have become a concern in CMOS chip design.

As noted above, CMOS circuits only utilize power when they are transitioning from one state to another. Thus, the amount of power used by a given CMOS circuit is proportional to the frequency of the clock signal being received at the circuit (which causes the transitioning of states). To prevent transient current levels in CMOS architecture during power up/power down, the frequency of the clock signal should be increased/decreased in steps with sufficient time at intermediate frequencies to allow stabilization until power up/power down is complete. The number of intermediate steps required to achieve a safe operation varies from chip to chip, depending on the design and manufacture of each particular chip. The amount of time required to achieve stabilization at each intermediate clock frequency also varies from chip to chip. These two parameters (number of steps and duration required at each step) can be obtained through simulation and experimentation during the characterization process of each type of chip.

There is therefore a need for a system and method for accomplishing a step-by-step increase and decrease of a clock frequency to CMOS circuits, such that a sufficient number of steps and sufficient stabilization time at each step is provided in order to prevent the propagation of excess transient signals.

SUMMARY OF THE INVENTION

The foregoing needs are satisfied by the present invention which provides a system and method for powering up and powering down CMOS logic circuits by increasing and decreasing the clock frequency in a gradual manner, allowing time for current levels to stabilize at intermediate clock frequencies until power up or power down operations are complete. The present invention may utilize two frequency dividers coupled to clock gating circuitry. The clock gating circuitry consists of a state machine that receives the following data from the system support processor upon power up/power down operations: 1) the number of intermediate frequency steps required for power up/power down; and 2) the stabilization time required at each frequency step. It generates as output a pair of signals (two logical bits) that control the operation of the frequency dividers. Additional signals, such as clock on, clock off, and a reset signal may also be implemented.

A first frequency divider receives a reference signal from the system clock and generates an output signal whose frequency is a fraction of the clock frequency. The exact ratio by which the clock frequency is divided is determined by the two bits sent to the dividers from the clock gating circuitry. This divider propagates the clock signal through a set/reset latch at the reduced frequency.

A second divider is set to divide by one and is always active. This divider is used to match the delay of the divide path caused by the first divider for purposes of feeding back to a phase lock loop within the system clock source.

To generate a divided frequency, the dividers utilize two comparator circuits coupled to the set/reset latch, one comparator sending signals into the "set" data port, and the other sending signals into the "reset" data port. Each comparator is coupled to a three-bit digital counter which increments on every cycle. These comparators use three-bit binary numbers generated from the two-bit values sent by the clock gating circuits and generate values of logical 1 when the counter value equals the value generated by the clock gating circuits. In this way, the comparators are able to toggle the set/reset latch so that the final output alternates between a logical 0 and a logical 1 at a rate predetermined by the clock gating circuitry. In this manner, the comparators are able to force the set/reset latch to output the equivalent of a lower frequency clock signal.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWING

For a more complete understanding of the present invention, and the advantages thereof, reference is now made to the following descriptions taken in conjunction with the accompanying drawings, in which:

FIG. 3 illustrates a table showing examples of two-bit inputs from the clock gating circuitry for given divide ratios;

DETAILED DESCRIPTION OF A PREFERRED EMBODIMENT OF THE INVENTION

In the following description, numerous specific details are set forth such as specific signal values, divide ratios, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

Figure 7:
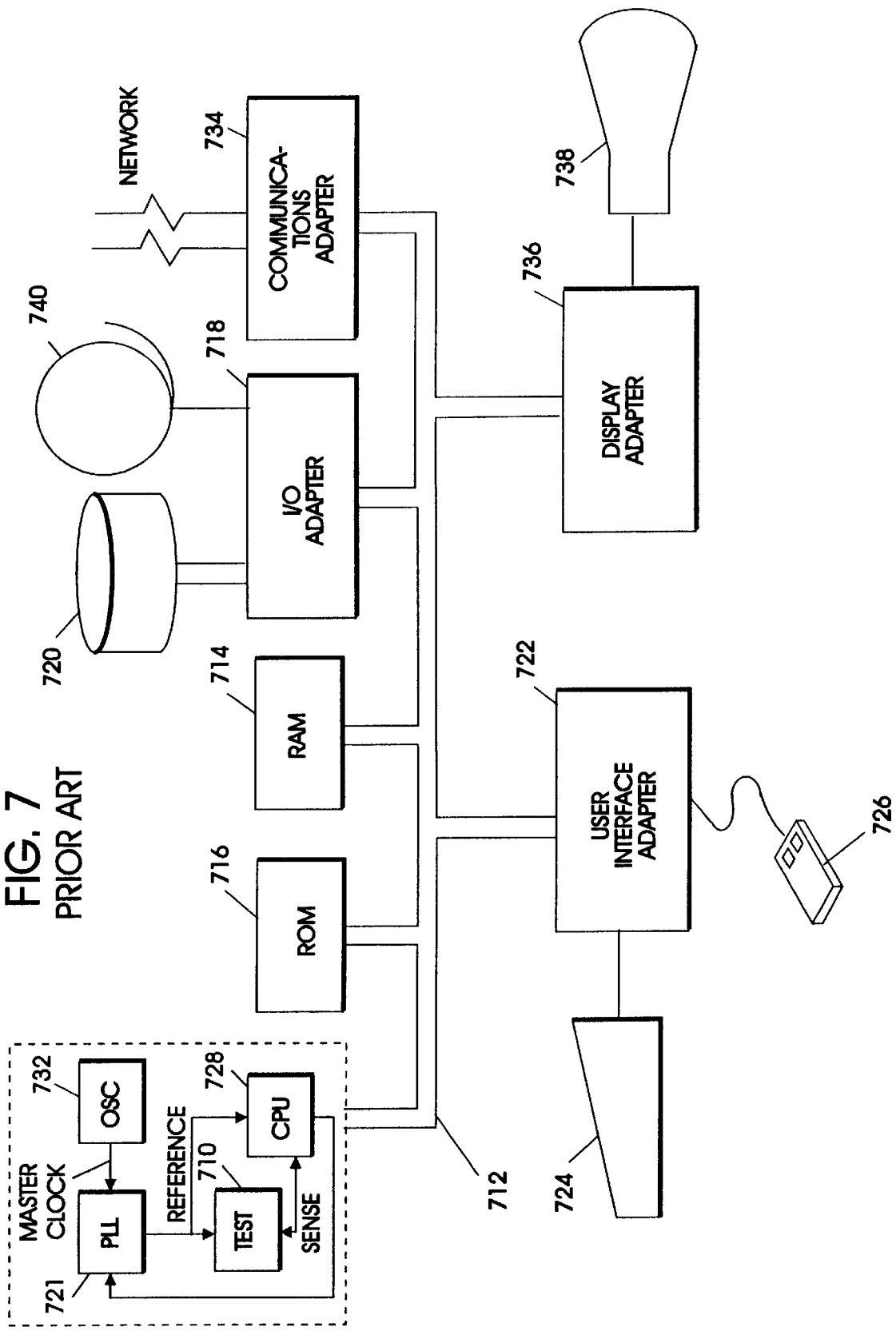
FIG. 7 illustrates a data processing system configured in accordance with the present invention.

Referring to FIG. 7, there is illustrated a data processing system using an embodiment of the present invention. FIG. 7 illustrates a typical hardware configuration of a workstation in accordance with the subject invention having processor 728, and a number of other units interconnected via system bus 712. The workstation shown in FIG. 7 includes random access memory (RAM) 714, read only memory (ROM) 716, and input/output (I/O) adapter 718 for connection of peripheral devices such as disk units 720 and tape drives 740 to bus 712, user interface adapter 722 for connecting keyboard 724, mouse 726, and/or other user interface devices such as a touch screen device (not shown) to bus 712, communications adapter 734 for connecting the workstation to a data processing network, and display adapter 736 for connecting bus 712 to display device 738.

As illustrated, CPU 728 is coupled to phase locked loop (PLL) circuit 721, test circuit 710 and oscillator 732. Generally, an oscillator is an electronic circuit that produces a periodically bearing output at a control frequency. Oscillator circuit 732 may produce the reference (Master) clock signal for input to both PLL circuit 721 and test circuit 710. Test circuit 710 is the subject of U.S. patent application Ser. No. 08/441,571, assigned to a common assignee, and incorporated by reference herein.

Figure 1:
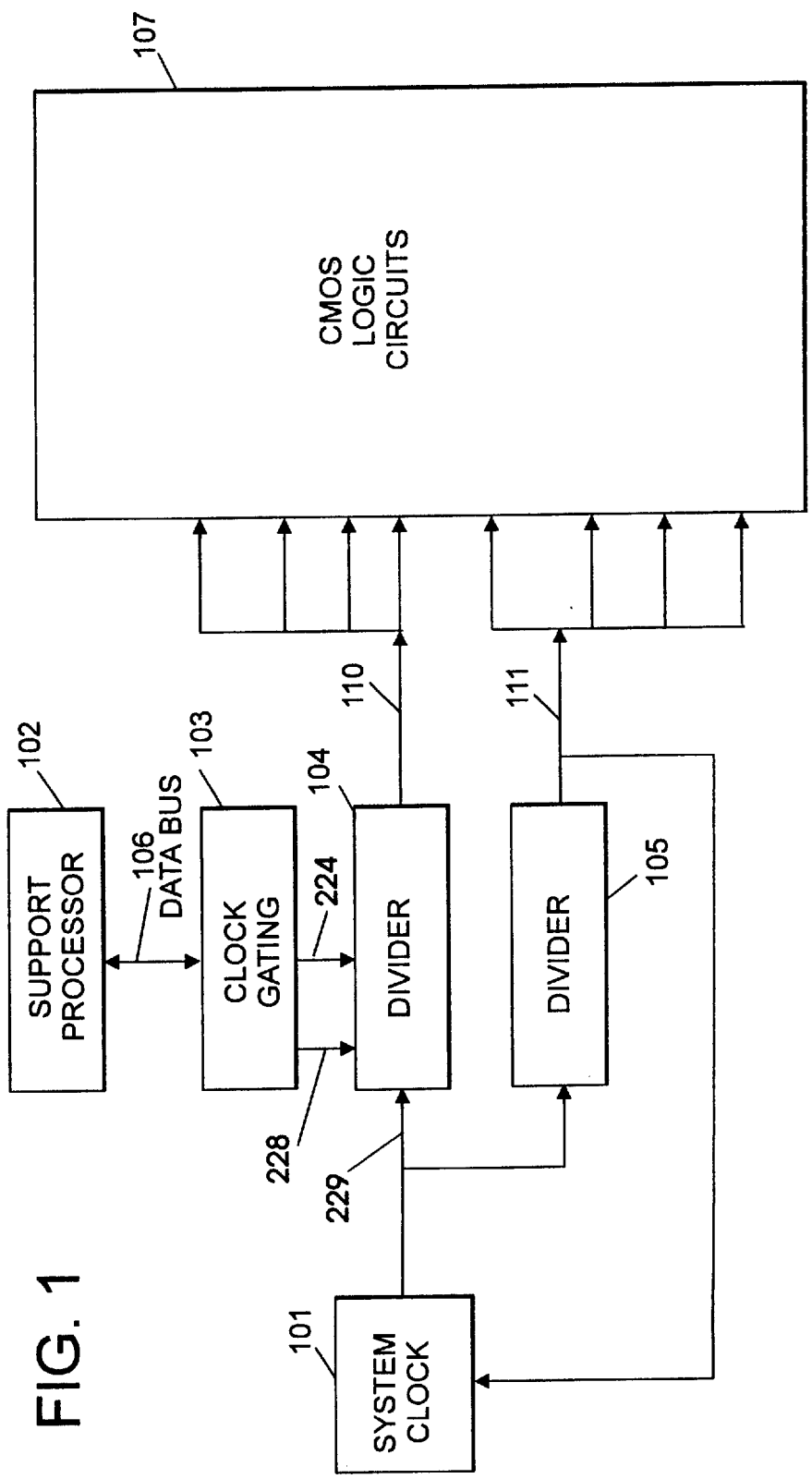
FIG. 1 illustrates a block diagram of a clocking system equipped with a controlling power up circuit.

Referring to FIG. 1, there is illustrated a clocking system configured to utilize the present invention for providing clock signals to CMOS logic circuits 107, which may be present in CPU 728 or any other portion of the workstation shown in FIG. 1. Support processor 102 may be comprised of an electronically programmable read only memory (EPROM) configured to control the initial start-up of a system in which the present invention could be an element, and store the information required by the present invention. This information relates to the power up/power down frequencies required by the entire system, and may include the values of the intermediate frequencies that clock gating 103 sets during power up/power down sequences and the amount of time that the present invention outputs any given frequency. Support processor 102 also determines when clock gating 103 initiates a power up/power down sequence. Support processors are well-known components of data processing systems. Circuits 101–105 may be implemented in circuitry 721.

As shown, support processor 102 conveys clocking information via data bus 106 to clock gating circuitry 103 based on predetermined values programmed into support processor 102. To obtain these values, a person of ordinary skill in the art could construct an engineering model of the system (e.g., CPU 728) in which the present invention would be integrated and test the model to determine the tolerance of the system to sudden changes in clock frequencies and power levels. The testing of the engineering model may involve taking near-real time measurements of current, voltage and heat levels. A person of ordinary skill could take these measurements and utilize them to calculate the values needed to be stored in support processor 102, including when to start and stop the clock signal to circuits 107, the appropriate intermediate clock frequencies and the amount of time required at each frequency. These calculations can be performed by considering factors such as the maximum speed of the various components, the ability of the power subsystem to protect against power surges, the ability of the cooling subsystem to dissipate heat, and the heat tolerance of any computer chips involved.

Clock gating circuitry 103 is a state machine which is configured to control the functioning of divider 104. When clock gating 103 receives a power up signal from support processor 102, clock gating 103 activates divider 104. When clock gating 103 completes any power down sequence, clock gating 103 idles divider 104.

During power up/power down, divider 104 receives a clock signal from system clock 101, divides the frequency of the clock signal by some number according to a two-bit input (hereinafter referred as $DIV_{13}$ SEL) it receives from clock gating circuit 103, and sends the output to the various CMOS logic circuits which then draw current in proportion to the divided frequency.

Divider 105 divides the clock frequency by one, which is essentially the same as passing the clock signal from system clock 101 through unaltered. Divider 105 may supply a clock signal on line 111 to only a few logic circuits that need a full clock signal at all times. This will not adversely affect the advantages of the present invention whereby power consumption is lowered. Divider 105 is used primarily for the sense phase (line 112) of the PLL (not shown) in system clock 101. The reason this configuration utilizes divider 105 instead of simply passing the clock signal through is so that the amount of delay that the clock pulse experiences at this point in the setup will be the same during power up/power down and steady state operations. Keeping the delay times consistent helps to accommodate an adaptive feedback clocking system that is the subject of another invention.

Figure 2:
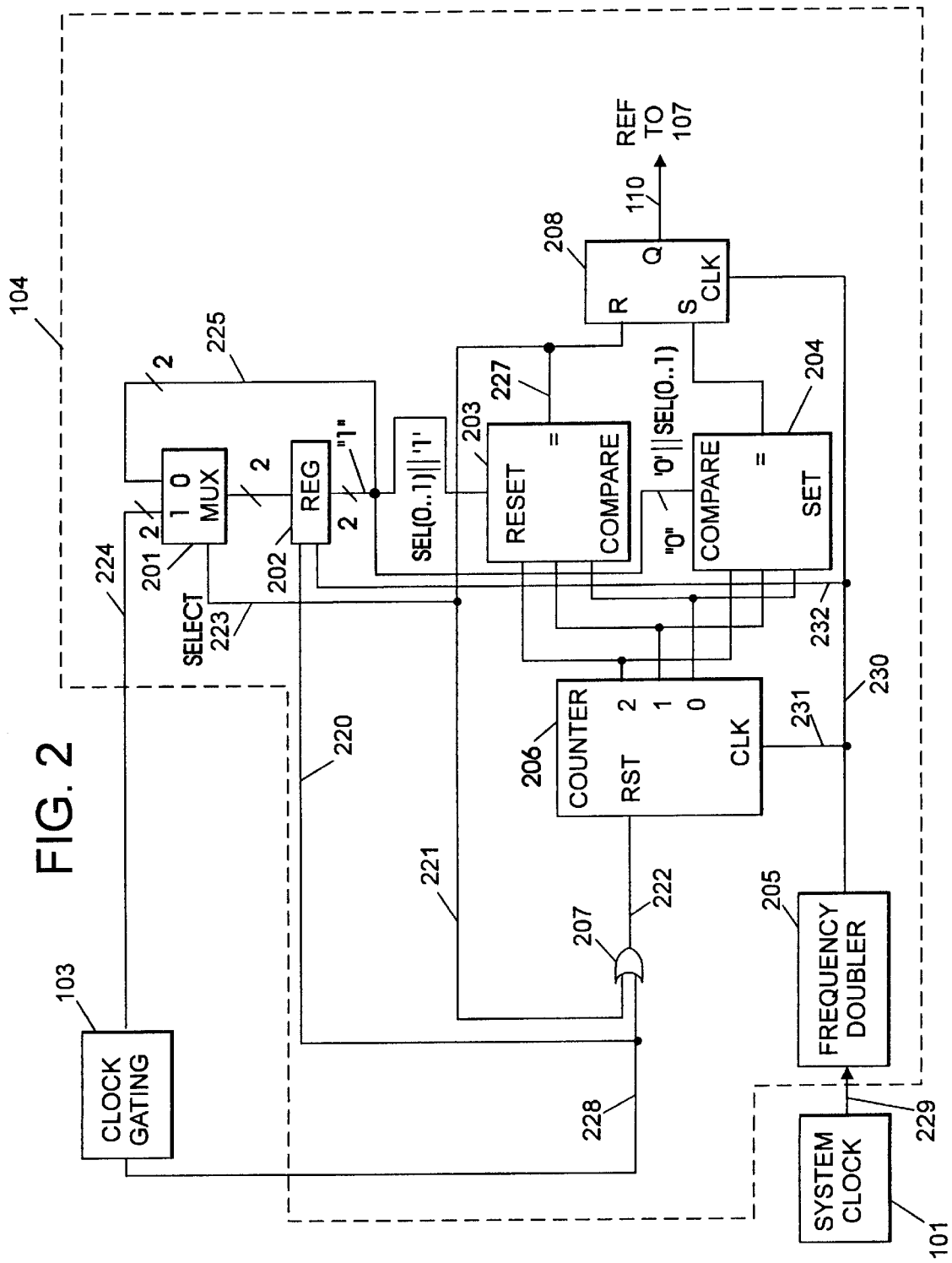
FIG. 2 illustrates a block diagram of logic circuits configured to power up CMOS circuits in accordance with the present invention.

Referring to FIG. 2, there is illustrated an arrangement of logic circuits configured to operate as divider 104. Divider 104 receives a system clock signal (hereinafter referred to as REF_CLK) via line 229. REF_CLK passes through frequency doubler 205. The output of doubler 205 (hereinafter referred to as REF_CLK') is a clock signal whose frequency is twice that of REF_CLK. REF_CLK' is transmitted to register 202, counter 206, and data latch 208 via lines 230, 231, and 232. The internal operation of divider 104 is therefore synchronized to REF_CLK', not REF_CLK.

Figure 6:
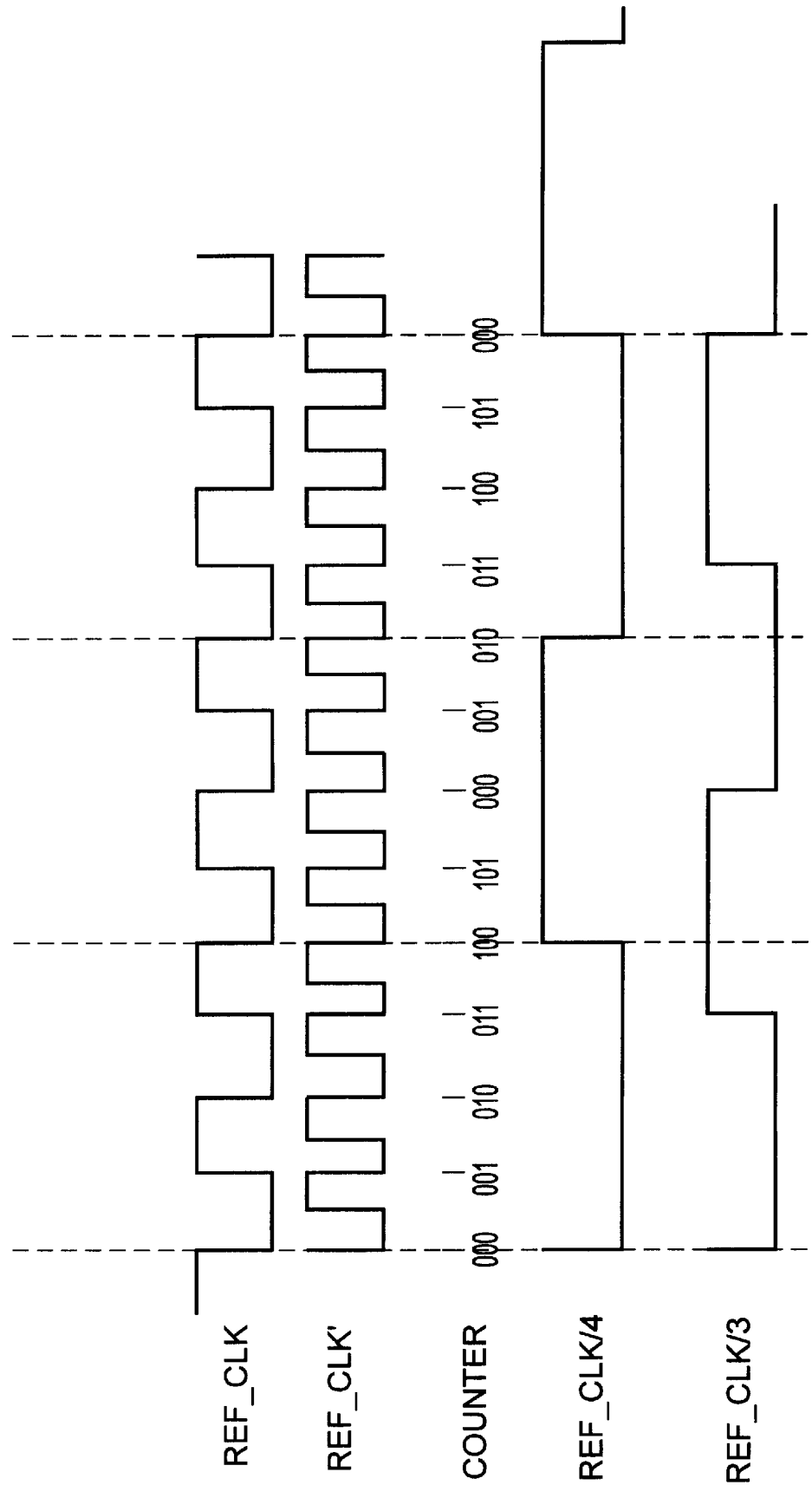
FIG. 6 illustrates a timing diagram showing how the present invention may be synchronized to double a reference clock frequency.

Referring to FIG. 6, there is illustrated a timing diagram showing how synchronizing the present invention to REF_CLK' is more efficient than synchronizing to REF_CLK. When dividing REF_CLK by four, (or any even number), synchronizing the present invention to REF_CLK presents no problem. In FIG. 6, all of the rising edges of REF_CLK/4 match the rising edges of the REF_CLK. Likewise, the falling edges of REF_CLK/4 match the falling edges of REF_CLK. When dividing REF_CLK by three (or any odd number), the rising and falling edges of the REF_CLK and REF_CLK/3 do not consistently occur at the same time. On the other hand, FIG. 6 shows that it is possible to divide REF_CLK by either three or four and match all falling and rising edges of REF_CLK/3 and REF_CLK/4 to falling and rising edges or REF_CLK'. Since the normal way to synchronize a series of timed components is to have them all activated by either a rising or falling edge, it is more efficient to double the reference frequency (doubler 205) and synchronize all the elements of the present invention to the doubled reference frequency.

When performing a power up or power down procedure, clock gating 103 transmits a two-bit value for DIV_SEL. The purpose of DIV_SEL is to indicate the ratio by which REF_CLK is to be divided. The two bits of DIV_SEL are transmitted from clock gating 103 to multiplexor (MUX) 201. The value received at the "select" port of MUX 201 will always be the output of comparator 203 transmitted via line 223. MUX 201 will allow the two bits through only if a logical 1 is transmitted over line 223 and received at the "select" port of MUX 201. If a logical 0 is transmitted over line 223 and received at the "select" port of MUX 201, MUX 201 will only propagate feedback from line 225.

Once MUX 201 allows a new value for DIV_SEL through, the two bits are stored in register 202. Register 202 clocks out DIV_SEL as it receives the falling edge of REF_CLK' via line 232, passing them on to comparators 203 and 204. At comparator 203, a logical 1 is appended to DIV_SEL as the least significant bit, forming a new three-bit value (hereinafter referred to as CMPR_RST). At comparator 204, DIV_SEL is appended to a logical 0, so that a 0 becomes the most significant bit, forming a new three-bit value (hereinafter referred to as CMPR_SET).

Counter 206 is coupled to the two comparators and is capable of counting from 0 to 7 (binary 000 to 111). At the beginning of each power up/power down operation, OR gate 207 receives a reset signal from clock gating 103 via line 228. This causes gate 207 to evaluate to a logical 1, which causes counter 206 to reset to a count of zero (000). This reset signal from clock gating 103 is also provided to register 202 via line 220 to force an output of zero from register 202, which causes comparator 204 to output a logical 1, resulting in latch 208 outputting a logical 1 at the next falling edge of REF_CLK'.

During the power down/power up operation, counter 206 increments on every cycle of REF_CLK' supplied to the CLK input of counter 206 by line 231 and sends the three-bit value (hereinafter referred to as COUNT) to comparators 203 and 204. The two comparators will compare the values of CMPR_RST and CMPR_SET to COUNT. Comparator 203 will output a logical 1 for exactly one cycle of REF_CLK' if COUNT=CMPR_RST. Similarly, comparator 204 will output a logical 1 for exactly one cycle if COUNT=CMPR_SET.

If comparator 203 evaluates to a logical 1, the following occurs: 1) The logical 1 will be sent to OR gate 207 via line 221. Gate 207 will evaluate to a logical 1, which will then be sent via line 222 to counter 206, thereby resetting the count to 000 at the next falling edge of REF_CLK'. 2) The logical 1 is sent to latch 208, which will output a logical 0. 3) MUX 201 receives a logical 1 at the "select" port, and responds by selecting line 224 as the active channel.

If comparator 204 evaluates to a logical 1, then the output of latch 208 will be a logical 1. Latch 208 is a set/reset latch, so it will remain in a state until a new signal forces it into a different state. Thus as the counter increments and is reset, comparators 203 and 204 will force data latch 208 to evaluate as a logical 1 or a logical 0 at regular intervals, resulting in a clock signal whose frequency is a fraction of the original clock frequency from system clock 101.

When the outputs of comparators 203 and 204 are zero at the same time, no change occurs in latch 208 (i.e., latch 208 keeps its output state).

Figure 4:
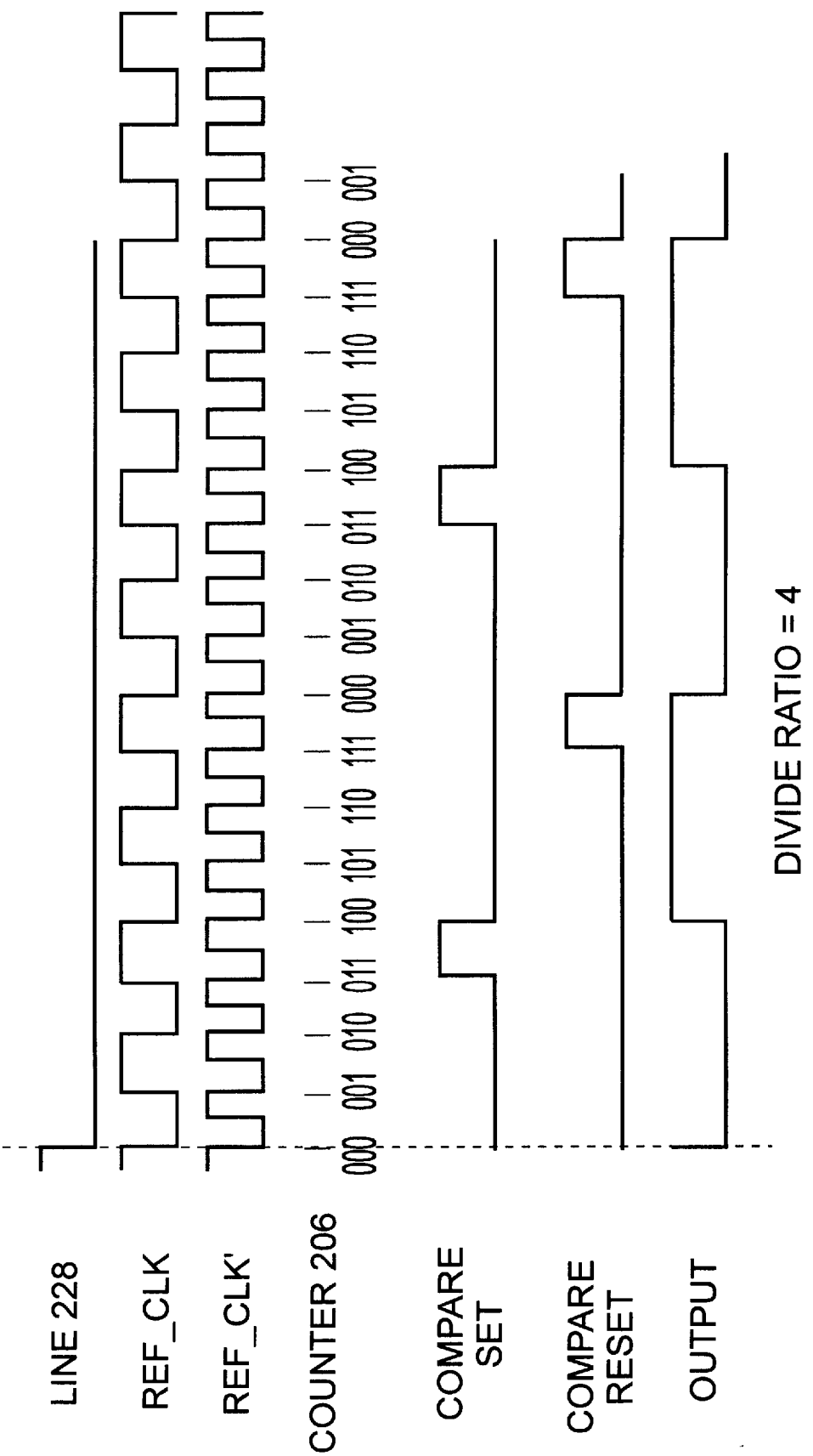
FIG. 4 illustrates a timing diagram showing the results of various signals within the present invention wherein the frequency divider is set to divide clock signal by 4.

Referring to FIG. 4, there is illustrated an example of how the present invention divides the reference frequency from system clock 101 by 4. We will assume that the initial state of latch 208 is a logical 0, that counter 206 has been reset to a value of 000, and that all of the elements of the circuit are triggered on the falling edge of REF_CLK'. At a time dictated by its internal algorithm, clock gating 103 sends the 2-bit DIV_SEL of a logical '11' to MUX 201. On the next cycle of REF_CLK' in which MUX 201 receives a logical 1 at its "select" port, MUX 201 will pass the '11' to register 202. This value then passes to comparators 203 and 204. At comparator 203, an extra bit with a value of 1 will be added to the end of DIV_SEL, resulting in a value of '111' for CMPR_RST. At comparator 204, an extra bit with a value of 0 will be added to the beginning of DIV_SEL, resulting in a value of '011' for CMPR_SET. The output of gate 208 remains 0 until counter 206 has incremented to a logical 011. At that time, comparator 204 will output a logical 1 to gate 208. As comparator 204 drops back down to a logical 0, gate 208 is set into a logical state of 1. This state continues until counter 206 has incremented to a value of logical 111. At that time, comparator 203 will output a logical 1 to gate 208, MUX 201, and gate 207 for one cycle. As comparator 203 drops its output back to a logical 0, latch 208 is triggered to output a logical state of 0, MUX 201 switches to line 224, and counter 206 resets to 000. This process is repeated for as long as the value input as DIV_SEL is a logical 11. The resulting output of data latch 208 are alternating logical states of 0 and 1 that are precisely timed so that they become a slowed down version of the reference clock signal, that is slower than the reference clock signal by a factor of 4.

The present invention operates similarly for other divide ratios, such as those shown in FIG. 3. The table of FIG. 3 gives an example of divide ratios and corresponding values of DIV_SEL that are sent from clock gating circuit 103 to mux 201. The values therein are derived from the following algorithm: Subtract 1 from the desired divide ratio and convert the result into a binary value. This value now becomes DIV_SEL. The number of bits required for DIV_SEL in this setup corresponds to the largest desired divide ratio. If, for example, a divide ratio of 5 is desired, the number of bits required for DIV_SEL will be three, since 5−1=4 or 100 in binary. Add a '1' as an extra rightmost bit to obtain CMPR_RST, and a '0' as the leftmost bit to obtain CMP_SET. In this example, CMPR_SET and CMP_RST always have one more bit than DIV_SEL. As illustrated above, this numbering scheme insures that when repeatedly counting from zero to CMPR_SET to CMPR_RST, the present invention outputs a clock edge (either rising or falling) on every Nth clock edge of REF_CLK, where N=the divide ratio. The result is a new signal with a frequency equal to the frequency of REF_CLK divided by N. As noted earlier, the divide ratio N is dependent upon various factors considered by support processor 102 when determining N.

Figure 5:
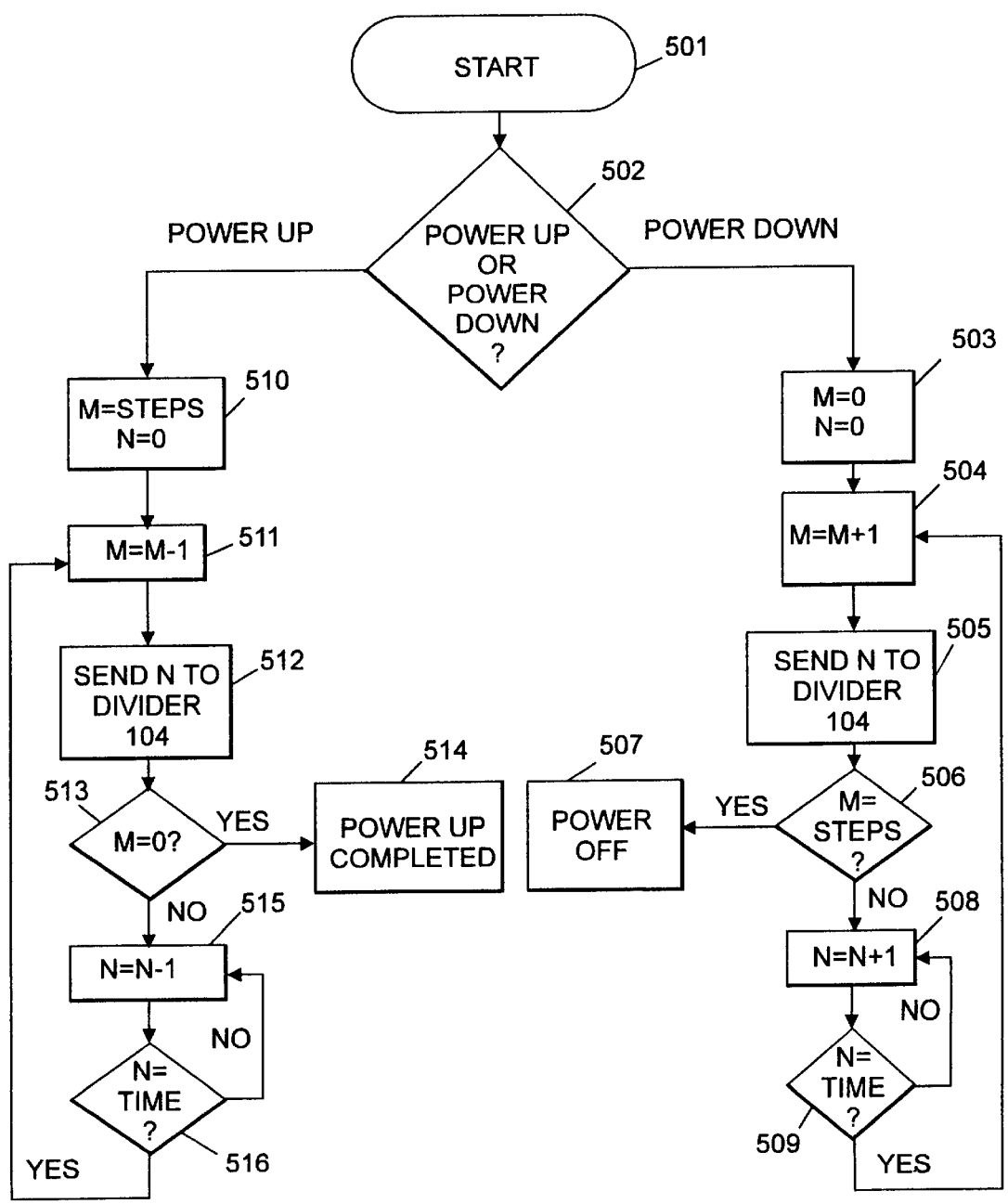
FIG. 5 illustrates a flow diagram in accordance with the present invention.

Clock gating circuitry 103 may be configured in accordance with the flow diagram illustrated in FIG. 5. The process begins at step 501 and proceeds to step 502 wherein a determination is made as to whether the system is in a power up or power down mode as received from source processor 102. If the system is in a power down mode then the process proceeds to step 503 wherein M is set to a value of 0 and N is set to a value of 0. The process then proceeds to step 504 wherein M is incremented. The process then proceeds to step 505 wherein the value of N is sent to divider 104 via data bus 106. The process then proceeds to step 506 wherein a determination is made as to whether M is equal to the number of frequency steps (STEPS) that the power down procedure will require. If it is determined at step 506 that M equals STEPS, then the process proceeds to step 507, at which time the clock gating shuts down along with the rest of the system. Clock gating 103 may then send a clock_off or reset signal to divider 104. If M does not equal STEPS, then the process proceeds to step 508 wherein N is incremented.

The next step is 509, where it is determined whether N equals the time required at that frequency step (TIME). If N does not equal TIME, then the process loops back to step 508 wherein N is incremented. If N equals TIME, then the process loops back to step 504 wherein M is incremented.

If it is determined at step 502 that the present invention is to perform a power up procedure, then the process proceeds from step 502 to step 510 wherein M is set equal to the number of frequency steps required for power up and N is set equal to 0. At this time, clock gating 103 may send a clock_on signal to divider 104. The process proceeds to step 511 wherein M is decremented. The next step is 512 wherein the value for N is sent to divider 104. Then the process continues to step 513 wherein it is determined whether M equals 0. If M equals 0, then the process continues to step 514 wherein power up is completed with a full clock signal sent to circuits 107. If M does not equal 0, then the process continues to step 515 wherein N is decremented. The following step is 516 wherein it is determined whether N equals TIME. If N does not equal TIME, then the process loops back to step 515 wherein N is decremented. If N equals TIME, then the process loops back to step 511 wherein M is decremented.

A signal may be sent back to support processor 102 from clock gating 103 notifying support processor 102 that the clock signal from divider 104 to circuits 107 is on or off. Support processor 102 is also programmed in a manner well-known in the art to send a signal to clock gating 103 to start or stop the clock.

Note, operation of CPU 728 may be inhibited by support processor 102 until the frequency supplied to circuits 107 is completely powered up and running at a full frequency. Such a signalling may be part of the IPL (initialization) of CPU 728.

Although the present invention and its advantages have been described in detail, it should be understood that various changes, substitutions and alterations can be made herein without departing from the spirit and scope of the invention as defined by the appended claims.

What is claimed is:

1. A method for providing a first clock signal to logic circuitry, said method comprising the steps of:
    during power up of said logic circuitry,
        receiving said first clock signal from a clock source, wherein said first clock signal has a first frequency;
        transforming said first clock signal into a second clock signal having a second frequency that is a fraction of said first frequency of said first clock signal;
        delaying said first clock signal to provide a delayed clock signal concurrent with said step of transforming;
        sending said second clock signal to said logic circuitry; and
        sending said delayed clock signal to said logic circuitry concurrent with said step of sending said second clock signal to said logic circuitry.

2. The method as recited in claim 1, further comprising the step of:
    after a predetermined time period wherein said second clock signal is being sent to said logic circuitry at said second frequency, modifying said second clock signal to be sent to said logic circuitry at said first frequency.

3. The method as recited in claim 2, further comprising the step of:
    during power down of said logic circuitry,
        transforming said first clock signal into a third clock signal to be sent to said logic circuitry, wherein said third clock signal has a third frequency that is a fraction of said first frequency of said first clock signal.

4. The method as recited in claim 1, further comprising the steps of:
    after a predetermined time period wherein said second clock signal is being sent to said logic circuitry at said second frequency, modifying said second clock signal to be sent to said logic circuitry at a third frequency wherein the third frequency is a fraction of said first frequency and is greater in frequency than said second frequency; and
    after a predetermined time period wherein said second clock signal is being sent to said logic circuitry, modifying said second clock signal to be sent to said logic circuitry at said first frequency.

5. The method as recited in claim 1, wherein said logic circuitry is implemented in CMOS.

6. An apparatus for supplying a first clock signal to CMOS logic circuitry, said apparatus comprising:
    during power up of said logic circuitry,
        means for receiving said first clock signal from a clock source, wherein said first clock signal has a first frequency;
        means for transforming said first clock signal into a second clock signal having a second frequency that is a fraction of said first frequency of said first clock signal;
        delaying said first clock signal to provide a delayed clock signal concurrent with transforming said first clock signal into the second clock signal;
        means for sending said second clock signal to said logic circuitry; and
        means for sending said delayed clock signal to said logic circuitry concurrent with sending said clock signal.

7. The apparatus as recited in claim 6, further comprising:
    means for modifying said second clock signal to be sent to said logic circuitry at said first frequency after a predetermined time period wherein said clock signal is being sent to said logic circuitry.

8. The apparatus as recited in claim 7, further comprising:
    during power down of said logic circuitry,
        means for transforming said first clock signal into a third clock signal to be sent to said logic circuitry, wherein said third clock signal has a third frequency that is a fraction of said first frequency of said first clock signal.

9. The apparatus as recited in claim 6, further comprising:
    means for modifying said second clock signal to be sent to said logic circuitry at a third frequency after a predetermined time period wherein said clock signal is being sent to said logic circuitry, wherein said third frequency is a fraction of said first frequency and is greater in frequency than said second frequency; and
    means for modifying said second clock signal to be sent to said logic circuitry at said first frequency after a predetermined time period wherein said second clock signal is being sent to said logic circuitry at said third frequency.

10. The apparatus as recited in claim 6, wherein said transforming means further comprises:
   means for receiving a coded signal corresponding to a predetermined divide ratio parameter N, where N is a positive number;
   a first comparator coupled to said means for receiving said coded signal;
   a second comparator coupled to said means for receiving said coded signal;
   a counter coupled to said first and second comparators, wherein said counter is coupled to said clock source; and
   a set/reset latch coupled to said clock source, said first comparator, said second comparator, and said sending means.

11. The apparatus as recited in claim 10, wherein a reset input of said counter is coupled to an output of said first comparator.

12. The apparatus as recited in claim 10, wherein said first clock signal is supplied to clock inputs of said counter and said latch.

13. The apparatus as recited in claim 10, wherein said clock source is a frequency doubler circuit.

14. A data processing system, comprising:

clock means for providing a system clock signal;

a first divider circuit coupled to the clock means for receiving the system clock signal, the first divider circuit dividing the system clock signal to provide a first divided clock signal having a first frequency during a preselected period of time corresponding to a power up operation of the data processing system, and having a second frequency after the preselected period of time; and a second divider circuit coupled to the clock means for receiving the system clock signal, the second divider circuit delaying the system clock signal to provide a first delayed clock signal, wherein the first delayed clock signal has a substantially same delay as the first divided clock signal.

15. The data processing system of claim 14 wherein the first divider clock signal and the delayed divider clock signal are provided to a CMOS logic circuit.

* * * * *